US009409767B2

(12) United States Patent
Gardner et al.

(10) Patent No.: US 9,409,767 B2
(45) Date of Patent: Aug. 9, 2016

(54) ENERGY STORAGE STRUCTURE, METHOD OF MANUFACTURING A SUPPORT STRUCTURE FOR SAME, AND MICROELECTRONIC ASSEMBLY AND SYSTEM CONTAINING SAME (75) Inventors: Donald S. Gardner, Los Altos, CA (US); Zhaohui Chen, San Jose, CA (US); Wei C. Jin, Sunnyvale, CA (US); Eric C. Hannah, Pebble Beach, CA (US); John L. Gustafson, Pleasanton, CA (US); Tomm V. Aldridge, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 368 days.

(21) Appl. No.: 13/977,140

(22) PCT Filed: Nov. 3, 2011

(86) PCT No.: PCT/US2011/059211
§ 371 (c)(1),
(2), (4) Date: Jun. 28, 2013

(87) PCT Pub. No.: WO2013/066337
PCT Pub. Date: May 10, 2013

(65) Prior Publication Data
US 2013/0279137 A1     Oct. 24, 2013

(51) Int. Cl.
*H01G 9/00*     (2006.01)
*B81B 7/00*     (2006.01)
(Continued)

(52) U.S. Cl.
CPC ............ *B81B 7/0077* (2013.01); *C25F 3/02* (2013.01); *C25F 3/12* (2013.01); *H01G 11/04* (2013.01);
(Continued)

(58) Field of Classification Search
CPC ....... H01G 11/04; H01G 11/30; H01G 11/26; H01G 9/00
USPC .......... 361/502, 503–504, 412, 525, 528–529
See application file for complete search history.

(56) References Cited

U.S. PATENT DOCUMENTS 5,581,454 A      12/1996  Collins
5,635,419 A  *   6/1997   Geiss ................ H01L 27/10861
                                                          257/E21.012
(Continued)

FOREIGN PATENT DOCUMENTS

CN          1096611 A       12/1994
CN          1719619 A        1/2006
(Continued)

OTHER PUBLICATIONS

International Preliminary Report on Patentability received for International Application No. PCT/US2011/059211, mailed on May 15, 2014, 4 pages.
(Continued)

*Primary Examiner* — Nguyen T Ha
(74) *Attorney, Agent, or Firm* — Kenneth A. Nelson (57) ABSTRACT An energy storage structure includes an energy storage device containing at least one porous structure (110, 120, 510, 1010) that contains multiple channels (111, 121), each one of which has an opening (112, 122) to a surface (115, 116, 515, 516, 1015, 1116) of the porous structure, and further includes a support structure (102, 402, 502, 1002) for the energy storage device. In a particular embodiment, the porous structure and the support structure are both formed from a first material, and the support structure physically contacts a first portion (513, 813, 1213) of the energy storage device and exposes a second portion (514, 814, 1214) of the energy storage device.

10 Claims, 9 Drawing Sheets (51) Int. Cl.
*C25F 3/02* (2006.01)
*H01G 11/04* (2013.01)
*H01M 4/00* (2006.01)
*H01G 11/26* (2013.01)
*H01G 11/30* (2013.01)
*C25F 3/12* (2006.01)
*H01M 4/04* (2006.01)
*H01M 4/38* (2006.01)

(52) U.S. Cl.
CPC ............... *H01G 11/26* (2013.01); *H01G 11/30* (2013.01); *H01M 4/00* (2013.01); *H01M 4/044* (2013.01); *H01M 4/386* (2013.01); *Y02E 60/13* (2013.01)

(56) References Cited

U.S. PATENT DOCUMENTS

| | | | |
|---|---|---|---|
| 5,748,438 | A | 5/1998 | Davis et al. |
| 6,737,830 | B2 | 5/2004 | Bean et al. |
| 6,751,085 | B1 | 6/2004 | Huntington |
| 6,833,983 | B2 * | 12/2004 | Nguyen .................. G06F 1/26 361/15 |
| 7,050,291 | B2 | 5/2006 | Narendra et al. |
| 7,324,328 | B2 * | 1/2008 | Narendra ............... H01G 9/155 361/303 |
| 7,393,604 | B2 | 7/2008 | Rocke et al. |
| 7,404,887 | B2 | 7/2008 | Katsir et al. |
| 7,541,782 | B2 | 6/2009 | Narendra et al. |
| 7,696,728 | B2 | 4/2010 | Cross et al. |
| 7,835,136 | B2 | 11/2010 | Feaver et al. |
| 7,907,430 | B2 | 3/2011 | Kularatna et al. |
| 2003/0086238 | A1 | 5/2003 | Bendale et al. |
| 2003/0165741 | A1 | 9/2003 | Maly-Schreiber et al. |
| 2004/0070921 | A1 | 4/2004 | Ikeda et al. |
| 2004/0090735 | A1 | 5/2004 | Kimura et al. |
| 2004/0228055 | A1 | 11/2004 | Pearson |
| 2005/0052169 | A1 | 3/2005 | Thrap |
| 2005/0262675 | A1 | 12/2005 | Sun |
| 2006/0021649 | A1 | 2/2006 | Kuroda et al. |
| 2006/0130300 | A1 | 6/2006 | Kobayashi et al. |
| 2007/0002525 | A1 | 1/2007 | Yamanoi et al. |
| 2007/0177332 | A1 | 8/2007 | Kobayashi et al. |
| 2008/0013224 | A1 | 1/2008 | Kim et al. |
| 2010/0008021 | A1 | 1/2010 | Hu et al. |
| 2011/0075324 | A1 | 3/2011 | Singh |
| 2011/0149476 | A1 | 6/2011 | Saida et al. |

FOREIGN PATENT DOCUMENTS

| | | | |
|---|---|---|---|
| CN | 1768404 | A | 5/2006 |
| CN | 102187413 | A | 9/2011 |
| JP | 10-321481 | A | 12/1998 |
| KR | 10-2007-0069281 | A | 7/2007 |
| KR | 10-2008-0018702 | A | 2/2008 |
| WO | 2005/022568 | A1 | 3/2005 |
| WO | 2011/123135 | A1 | 10/2011 |
| WO | 2013/048465 | A1 | 4/2013 |
| WO | 2013/066337 | A1 | 5/2013 |
| WO | 2013/085526 | A1 | 6/2013 |
| WO | 2013/089710 | A1 | 6/2013 |
| WO | 2013/095466 | A1 | 6/2013 |
| WO | 2013/100916 | A1 | 7/2013 |
| WO | 2013/100932 | A1 | 7/2013 |
| WO | 2013/101162 | A1 | 7/2013 |
| WO | 2013/126050 | A1 | 8/2013 |
| WO | 2013/147897 | A1 | 10/2013 |

OTHER PUBLICATIONS

"Method for super capacitor stacking", IP.com Prior Art Database Disclosure, IP.com Disclosure No. IPCOM000100600D, Publication Date: Mar. 15, 2005, 3 Pages.
International Search Report and Written Opinion received for International Application No. PCT/US2011/059211, mailed on Jul. 9, 2012, 10 pages.
Office Action received for Taiwanese Patent Application No. 101140316, mailed on Jan. 8, 2014, 9 Pages of Office Action and 6 Pages of English Translation.
International Search Report and Written Opinion received for International Application No. PCT/US2010/029821, mailed on Dec. 31, 2010, 9 pages.
International Preliminary Report on Patentability received for International Application No. PCT/US2010/029821, mailed on Oct. 11, 2012, 7 pages.
International Search Report and Written Opinion received for International Application No. PCT/US2011/054372, mailed on May 2, 2012, 10 pages.
International Preliminary Report on Patentability received for International Application No. PCT/US2011/054372, mailed on Apr. 10, 2014, 7 pages.
International Search Report and Written Opinion received for International Application No. PCT/US2011/064013, mailed on Aug. 28, 2012, 9 pages.
International Search Report and Written Opinion received for International Application No. PCT/US2011/067434, mailed on Sep. 10, 2012, 9 pages.
International Search Report and Written Opinion received for Internationai Application No. PCT/US2011/066650, mailed on Sep. 17, 2012, 10 pages.
International Search Report and Written Opinion received for Internationai Application No. PCT/US2011/064969, mailed on Sep. 17, 2012, 10 pages.
International Search Report and Written Opinion received for International Application No. PCT/US2012/025973, mailed on Jan. 31, 2012, 9 pages.
International Search Report and Written Opinion received for International Application No. PCT/US2012/031719, mailed on Nov. 28, 2012, 10 pages.
P. Sharma et al., "A review on electrochemical double-layer capcaitors," Energy conversion ancl management, vol. 51, Issue 12, Dec. 2010, pp. 2901-2912.
R. Kotz et al., "Principles and applications of electrochemical capacitors", Elect rochimica Acta, vol. 45, Issues 15-16, May 3, 2000, pp. 2483-2498.
Y. Zhang et al., "Progress of electrochemical capacitor electrode materials: A review", International journal of hyclrogen energy, vol. 34, Issue II, Jun. 2009, pp. 4889-4899.
International Search Report received for International Application No. PCT/US2011/068046, mailed on Sep. 19, 2012, 3 pages.
International Search Report and Written Opinion received for International Application No. PCT/US2011/067485, mailed on Sep. 12, 2012, 9 pages.
Desplobain et al., "Investigations on Porous Silicon as Electrode Material Electrochemical Capacitors", physica status solidi, vol. 4, Issue 6, May 2007, pp. 2180-2184.
Ritala et al., "Rapid Coating of Through-Porous Substrates by Atomic Layer Deposition," Chemical Vapor Deposition, vol. 12, Issue 11, Nov. 2006, pp. 655-658.
Office Action Received for Chinese Patent Application No. 201180074610.0 mailed on Mar. 18, 2016, 10 pages of Office Action and 5 pages of English Translation.

\* cited by examiner

ENERGY STORAGE STRUCTURE, METHOD OF MANUFACTURING A SUPPORT STRUCTURE FOR SAME, AND MICROELECTRONIC ASSEMBLY AND SYSTEM CONTAINING SAME

CROSS REFERENCE TO RELATED APPLICATION

This application is related to International Application No. PCT/US2010/29821, filed on Apr. 2, 2010 and assigned to the same assignee to which the present application is assigned.

FIELD OF THE INVENTION

The disclosed embodiments of the invention relate generally to energy storage devices, and relate more particularly to support structures for energy storage devices.

BACKGROUND OF THE INVENTION

Modern societies depend on the ready availability of energy. As the demand for energy increases, devices capable of efficiently storing energy become increasingly important. As a result, energy storage devices, including batteries, capacitors, electrochemical capacitors (ECs), (including pseudocapacitors and electric double-layer capacitors (EDLCs)—also known as ultracapacitors, among other names), hybrid ECs, and the like are being extensively used in the electronics realm and beyond. In particular, capacitors are widely used for applications ranging from electrical circuitry and power delivery to voltage regulation and battery replacement. Electrochemical capacitors are characterized by high energy storage capacity as well as other desirable characteristics including high power density, small size, and low weight, and have thus become promising candidates for use in several energy storage applications.

The related case mentioned above (International Application No. PCT/US2010/029821) discloses three-dimensional structures for forming high energy density electrochemical capacitors using, for example, porous silicon. In some of the disclosed embodiments, an electrochemical process was used to etch pores deep into a silicon structure and the pores were filled with an electrolyte or with a high-k dielectric material and/or a thin conductive film in combination with an electrolyte.

BRIEF DESCRIPTION OF THE DRAWINGS

The disclosed embodiments will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Certain figures may be shown in an idealized fashion in order to aid understanding, such as when structures are shown having straight lines, sharp angles, and/or parallel planes or the like that under real-world conditions would likely be significantly less symmetric and orderly. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, an energy storage structure comprises an energy storage device (e.g., an electrochemical capacitor) that includes at least one porous structure (e.g., porous silicon) containing multiple pores or channels, each one of which has an opening to a surface of the porous structure, and further comprises a support structure for the energy storage device. In a particular embodiment, the porous structure and the support structure are both formed from the same material, and the support structure physically contacts a first portion of the energy storage device and exposes a second portion of the energy storage device.

Thin-film electrochemical capacitor devices are easier to make than thick, three-dimensional EC devices but cannot store nearly as much energy as the thicker structures can Thicker, three-dimensional devices are thus preferred, but it can be challenging to scale up thin-film EC devices to achieve the desired thicknesses, largely because the thicker structures are fragile and tend to break. Embodiments of the invention improve the strength of the porous structure by introducing a frame or scaffolding (i.e., the support structure mentioned above) that provides the necessary mechanical strength. This improvement in mechanical strength enables the substrate to be etched completely through, which in turn allows for through-substrate deposition of materials such as high-k dielectrics and low-resistivity conductors. Among other advantages, these materials lead to increased capacitances and/or breakdown voltages (and, hence, increased energy densities and energy storage capabilities), increased achievable power outputs, and decreased effective series resistances (ESR). Through-substrate deposition (carried out, for example, by atomic layer deposition, diffusion furnace, etc.) for such materials tends to be faster (and, thus, more cost-effective) than other techniques, at least in part because the material to be deposited can be introduced into one end of a pore and pumped out the other rather than needing to be pumped back out the first end as is true in non-through-substrate situations.

Although much of the discussion herein will focus on electrochemical capacitors, the "energy storage device" designation explicitly includes, in addition to ECs, hybrid electrochemical capacitors and pseudocapacitors, which, like electrochemical capacitors, are discussed in more detail below, as well as batteries, fuel cells, and similar devices that store energy. "Energy storage structure" is a phrase used herein to refer to an energy storage device together with a support structure, and various embodiments of such structures are disclosed herein. Energy storage structures according to embodiments of the invention can be used for a wide variety of applications, including in automobiles, buses, trains, airplanes, other transportation vehicles, home energy storage, storage for energy generated by solar or wind energy generators, especially energy harvesting devices, and many others.

Electrochemical capacitors operate according to principles similar to those that govern conventional parallel plate capacitors, but certain important differences do apply. One significant difference concerns the charge separation mechanism: for ECs this typically takes the form of a so-called electric double layer, or EDL, rather than of the dielectric of a conventional capacitor. The EDL is created by the electrochemical behavior of ions at an interface between a high-surface area electrode and an electrolyte, and results in an effective separation of charge in spite of the fact that the layers are so close together. (Physical separation distances are on the order of a single nanometer.) Thus, a typical EC may be thought of as storing charge in its EDL. Each layer of the EDL is electrically conductive but the properties of the double layer prevent current from flowing across the boundary between them. (The EDL is further discussed below in connection with FIG. 3.)

As is true in conventional capacitors, capacitance in an electrochemical capacitor is proportional to the surface area of the electrodes and inversely proportional to the charge separation distance. The very high capacitances achievable in an electrochemical capacitor are due in part to the very high surface area attributable to the multi-channel porous structure and to the nanometer-scale charge separation distance attributable to the EDL, which arises due to the presence of an electrolyte, as explained above. One type of electrolyte that may be used in accordance with embodiments of the invention is an ionic liquid. Another is an electrolyte (e.g., $Li_2SO_4$, $LiPF_6$) comprising an ion-containing solvent. Organic electrolytes and solid-state electrolytes are also possible.

Pseudocapacitors are energy storage devices that behave like capacitors but also exhibit reactions that result in charge storage. Typically, one of the electrodes of a pseudocapacitor is coated with a transition metal oxide such as $MnO_2$, $RuO_2$, $NiO_x$, $Nb_2O_5$, $V_2O_5$, etc., or with other materials including $Mo_2N$, $W_2N$, $W_2C$ (tungsten carbide), $Mo_2C$, VC, a suitable conducting polymer, or a similar material. These materials can be used with an electrolyte such as potassium hydroxide (KOH); when the device is charged, the electrolyte will react with the material in a reaction that allows energy to be stored in a manner that has similarities to a battery's energy storage. More specifically, these materials store energy through highly-reversible surface and subsurface redox (faradic) reactions, but at the same time the electric double layer energy storage mechanism remains in place and provides the potential for high power.

Hybrid electrochemical capacitors are energy storage devices that combine the attributes of ECs and batteries. In one example, an electrode coated with a lithium ion material is combined with an electrochemical capacitor in order to create a device that has an EC's rapid charge and discharge characteristics and a battery's high energy density. On the other hand, hybrid ECs, like batteries, have shorter expected lifespans than do electrochemical capacitors.

Figure 1:
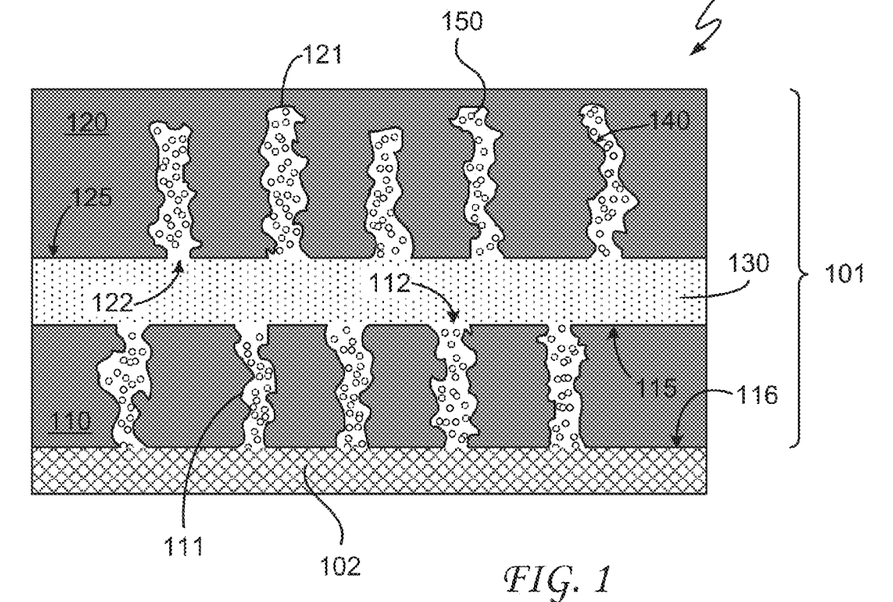
FIGS. 1 and 2 are cross-sectional views of an energy storage structure according to embodiments of the invention.
Figure 2:
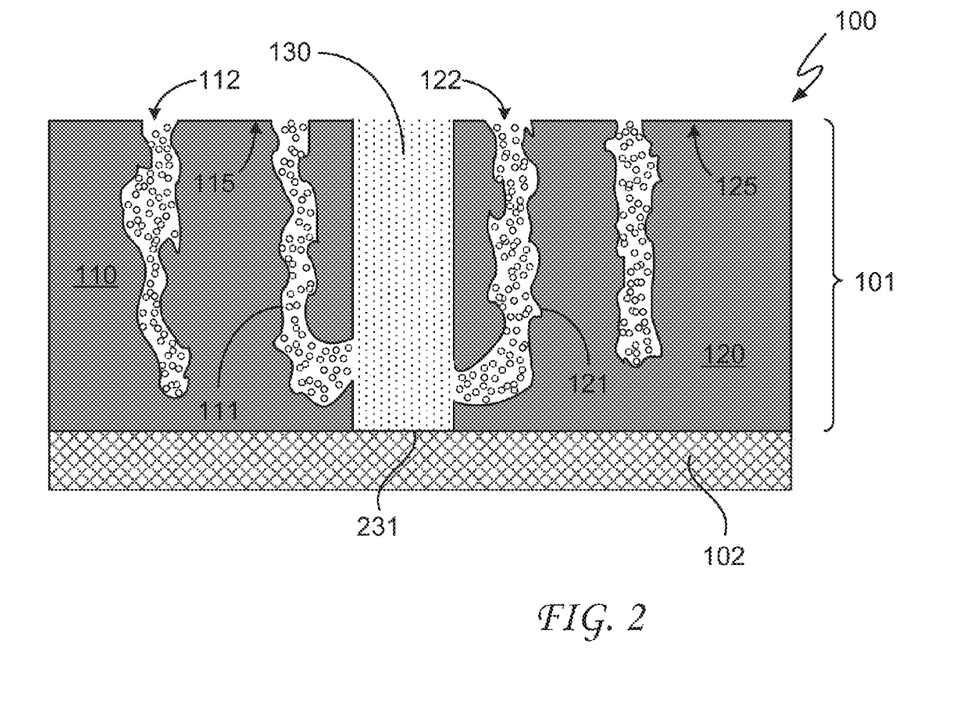

Referring now to the drawings, FIGS. 1 and 2 are cross-sectional views of an energy storage structure 100 according to embodiments of the invention. As illustrated in FIGS. 1 and 2, energy storage structure 100 comprises an energy storage device 101 and a support structure 102. Energy storage device 101 comprises an electrically conductive structure 110 and an electrically conductive structure 120 separated from each other by a separator 130 that is an electrical insulator and an ionic conductor. Separator 130 prevents electrically conductive structures 110 and 120 from physically contacting each other so as to prevent an electrical short circuit. (In other embodiments, for reasons discussed below, a separator is not necessary and can be omitted.)

At least one of electrically conductive structures 110 and 120 comprises a porous structure containing multiple channels, each one of which has an opening to a surface of the porous structure. This feature is a result of the process, described below, used to form the porous structure. As an example, the porous structure may be formed within a conductive or a semiconductive material. Alternatively, the porous structure may be formed within an insulating material (e.g., alumina) that has been coated with an electrically conductive film (e.g., an ALD conductive film such as titanium nitride (TiN)). In this regard, materials having greater electrical conductivity are advantageous because they lower the effective series resistance. In the illustrated embodiments, both electrically conductive structure 110 and electrically conductive structure 120 comprise such a porous structure. Accordingly, electrically conductive structure 110 comprises channels 111 with openings 112 to a surface 115 of the corresponding porous structure and electrically conductive structure 120 comprises channels 121 with openings 122 to a surface 125 of the corresponding porous structure.

Various configurations of energy storage device 100 are possible. In the embodiment of FIG. 1, for example, energy storage device 100 comprises two distinct porous structures (that is, electrically conductive structure 110 and electrically conductive structure 120) that have been bonded together face-to-face with separator 130 in between. As another example, in the embodiment of FIG. 2 energy storage device 100 comprises a single planar porous structure in which a first section (electrically conductive structure 110) is separated from a second section (electrically conductive structure 120) by a trench 231 containing separator 130. One of the electrically conductive structures will be the positive side and the other electrically conductive structure will be the negative side. As an example, separator 130 could be a permeable membrane or other porous polymer separator. In general, the separator prevents the physical contact of anode and cathode (which could cause an electrical malfunction in the device) while permitting the transfer of ionic charge carriers. In addition to polymer separators, several other separator types are possible. These include nonwoven fiber sheets, liquid membranes, polymer electrolytes, solid ion conductors, and the like.

It should be noted that the separator, although shown in FIG. 2, may not be necessary in the configuration illustrated there because, for example, support structure 102 could be used to maintain a physical separation between structures 110 and 120. As another example, electrically conductive structures 110 and 120 could each be attached to a ceramic package (not shown) that would keep the two electrically conductive structures physically separate from each other.

As an example, the porous structure of electrically conductive structures 110 and 120 can be created by a wet etch process in which a liquid etchant applied to a surface of the electrically conductive structures etches away portions of the electrically conductive structure in a way that is at least somewhat similar to the way water is able to carve channels in rock. This is why each one of the channels has an opening to the surface of the electrically conductive structure; the wet etch method is incapable of creating fully-enclosed cavities, i.e., cavities with no opening to the surface, like an air bubble trapped inside a rock, within the porous structure. This is not to say that those openings cannot be covered with other materials or otherwise closed up because of the presence of or addition of other materials—that is in fact likely to occur in several embodiments—but, whether covered or not, the described openings to the surface are a feature of each channel in each porous structure according to at least one embodiment of the invention. (One embodiment in which the openings may be covered up is one in which a layer of epitaxial silicon as a location for circuitry or other wiring is grown on top of the channels).

With the right etchant, it should be possible to make porous structures having the described characteristics from a wide variety of materials. As an example, a porous silicon structure may be created by etching a silicon substrate with a mixture of hydrofluoric acid and ethanol. More generally, porous silicon and other porous structures may be formed by such processes as anodization and stain etching.

Besides porous silicon, which has already been mentioned, some other materials that may be especially well-suited for energy storage devices according to embodiments of the invention are porous germanium and porous tin. Possible advantages of using porous silicon include its compatibility with existing silicon technology. Porous germanium enjoys a similar advantage as a result of existing technology for that material and, as compared to silicon, enjoys the further possible advantage that its native oxide (germanium oxide) is water-soluble and so is easily removed. (The native oxide that forms on the surface of silicon may trap charge, which is an undesirable result.) Porous germanium is also highly compatible with silicon technology. Possible advantages of using porous tin, which is a zero-band-gap material, include its enhanced conductivity with respect to certain other conductive and semiconductive materials. Other materials may also be used for the porous structure, including silicon carbide, alloys such as an alloy of silicon and germanium, and metals such as copper, aluminum, nickel, calcium, tungsten, molybdenum, and manganese.

Referring again to FIGS. 1 and 2, energy storage device 100 further comprises (in the embodiment illustrated in FIG. 1) an electrically conductive coating 140 on at least a portion of the porous structure and in at least some of channels 111 and/or channels 121. Such an electrically conductive coating may be necessary in order to maintain or enhance the conductivity of the porous structure, or it may be helpful in reducing ESR, thereby improving performance. For example, a device having lower ESR is able to deliver higher power (which may be manifested in terms of greater acceleration, more horse power, etc.). In contrast, higher ESR (a condition that prevails inside a typical battery) limits the amount of available energy, at least partially due to the fact that much of the energy is wasted as heat.

The FIG. 1 embodiment is one wherein channels 111 extend from surface 115 of porous structure 110 completely through the porous structure to an opposing surface 116 of porous structure 110, and is thus an example of what may be called an "etched-through" porous structure. This embodiment as illustrated shows the openings to surface 116 of channels 111 blocked by support structure 102; the illustrated embodiment, therefore, may not allow the through-substrate material deposition that was mentioned above as a possible advantage of etched-through porous structures. However, modified configurations of support structure 102, as well as various other support structure embodiments, can each support such through-substrate material deposition, as will be discussed in detail below.

Also illustrated in FIGS. 1 and 2 is an electrolyte 150, which gives rise to the EDL, as explained above. Electrolyte 150 (as well as the other electrolytes described herein) is represented in the drawings using a random arrangement of circles. This representation is intended to convey the idea that the electrolyte is a substance (liquid or solid, including gel-like materials) containing free ions. The circles were chosen for convenience and are not intended to imply any limitation as to the electrolyte components or qualities, including any limitation with respect to the size, shape, or number of the ions.

Figure 3:
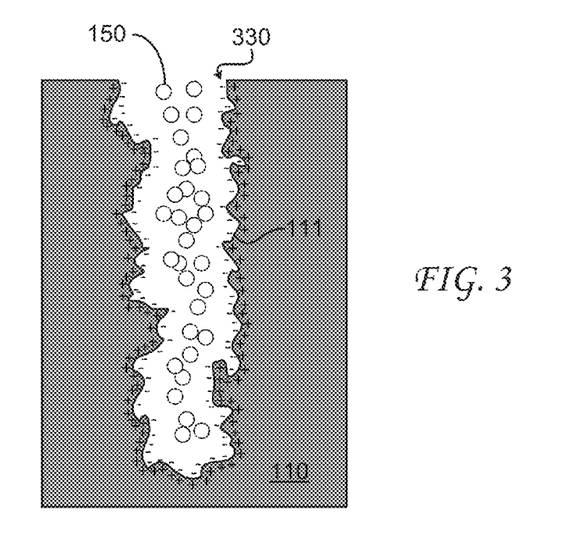
FIG. 3 is a depiction of an electric double layer formed within a channel of a porous structure according to an embodiment of the invention.

After the introduction of electrolyte 150, an electric double layer is formed within the channels of the porous structure, as depicted schematically in FIG. 3. In that figure, an electrical double layer 330 has been formed within one of channels 111. EDL 330 is made up of two layers of ions, one of which is the electrical charge of the sidewalls of channel 111 (depicted as being positive in FIG. 3 but which in other embodiments could be negative) and the other of which is formed by free ions in the electrolyte. EDL, 330 thus provides a separation of charge that is necessary in order for the capacitor to function. As explained earlier, the large capacitance, and, hence, energy storage potential, of electrolytic ECs arises in part due to the small (approximately 1 nm) separation distance between electrolyte ions and the electrode surface charge.

It should be noted that the FIG. 1 and FIG. 2 depictions of the porous structures are highly idealized in that, to mention just one example, all of channels 111 and 121 are shown as only extending vertically. In reality the channels would branch off in multiple directions to create a tangled, disorderly pattern that may look something like the porous structure shown in FIG. 4.

Figure 4A:
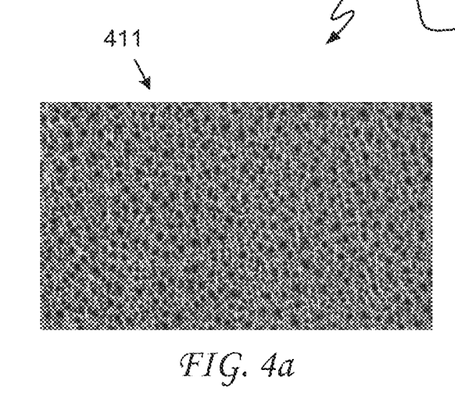
FIGS. 4a and 4b are images of, respectively, a surface and a cross-sectional slice of a porous silicon structure according to embodiments of the invention.
Figure 4B:
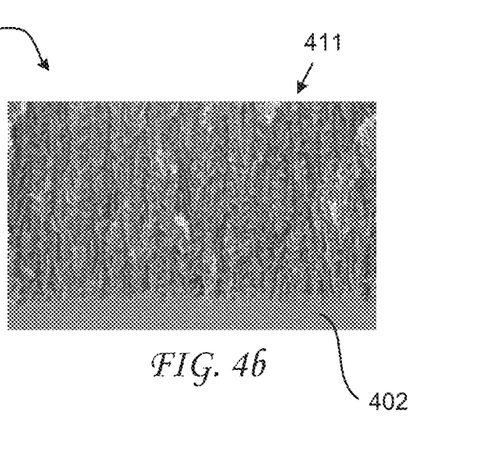

FIGS. 4a and 4b are scanning electron microscope (SEM) images of respectively, a surface and a cross-sectional slice of a porous structure 400 (in this case porous silicon) according to embodiments of the invention. As illustrated, porous structure 400 contains multiple channels 411. It should be understood that channels 411 are likely to twist and turn along their lengths such that a single channel may have both vertical and horizontal portions as well as portions that are neither completely vertical nor completely horizontal but fall somewhere in between. Note that in FIG. 4b, the channels extend near to but do not quite reach a bottom of the etched structure, thus leaving a layer 402 of un-etched silicon underneath the channels. In one embodiment, un-etched layer 402 acts as the support structure for porous structure 400 (and for the corresponding energy storage device, not shown), and is thus the equivalent of support structure 102.

Figure 5:
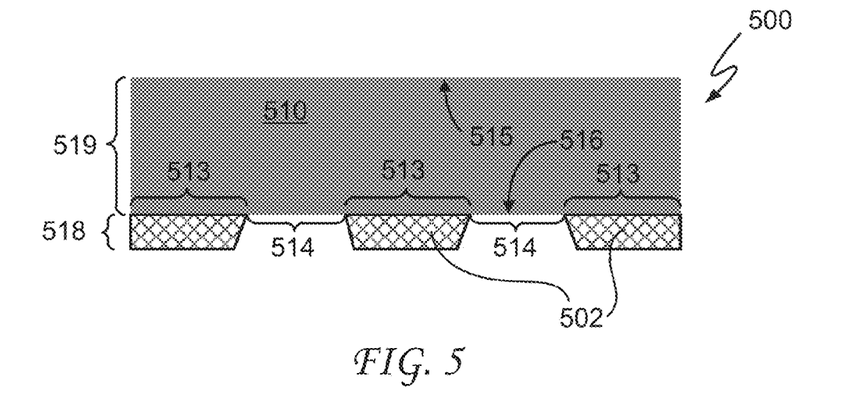
FIG. 5 is a cross-sectional view of an energy storage structure that includes a support structure according to an embodiment of the invention.

FIG. 5 is a cross-sectional view of an energy storage structure 500 that includes a support structure according to an embodiment of the invention. As illustrated in FIG. 5, energy storage structure 500 comprises an energy storage device, of which only a porous structure 510 is shown, and a support structure 502. Porous structure 510 contains multiple channels, each one of which has an opening to a surface of the porous structure. The porous structure is formed from a first material, which can in various embodiments be any of the materials described above as being suitable for porous structures according to embodiments of the invention, namely, silicon, germanium, tin, copper, aluminum, nickel, calcium, tungsten, molybdenum, manganese, silicon carbide, and alloys such as an alloy of silicon and germanium. Porous structure 510 is thus similar to porous structures 110 and 120 that are shown in FIGS. 1-3 and are described above. Support structure 502, in one embodiment, is formed from the same material from which porous structure 510 is formed. In the illustrated embodiment, support structure 502 physically contacts a portion or portions 513 of porous structure 510 and exposes a portion or portions 514 of the porous structure, where portions 513 and 514 are arranged in alternating relationship with each other. Of course, many other configurations of exposed and unexposed portions are also possible, and the configuration of FIG. 5 should not be seen as necessarily indicative or characteristic of all such configurations or even of any other such configuration, nor should it be seen as limiting in any way the wide variety of other configurations that are possible. For example, instead of being located exclusively on a single surface (e.g., a bottom surface) as shown in FIG. 5, the exposed and/or the unexposed portions may be located at one or more different surfaces or regions of a porous structure. Thus an exposed portion may consist of a top surface (or part of a top surface) while an unexposed portion may consist of a bottom surface (or part of a bottom surface). Alternatively, an exposed and/or an unexposed portion may consist of some or all of a side surface or of some other region, as in the case, for example, of a belt-like support structure formed around a middle region of a wafer in which pores are formed. Some, but by no means all, of the other possible configurations are shown in subsequent figures and described below.

Referring still to FIG. 5, porous structure 510 comprises a surface 515 and an opposing surface 516. The channels that are located in porous structure 510—the channels that make the porous structure porous—are not shown in FIG. 5, but in certain embodiments at least some of the channels extend from surface 515 all the way to surface 516, and thus are part of what is referred to herein as an etched-through porous structure.

Figure 6:
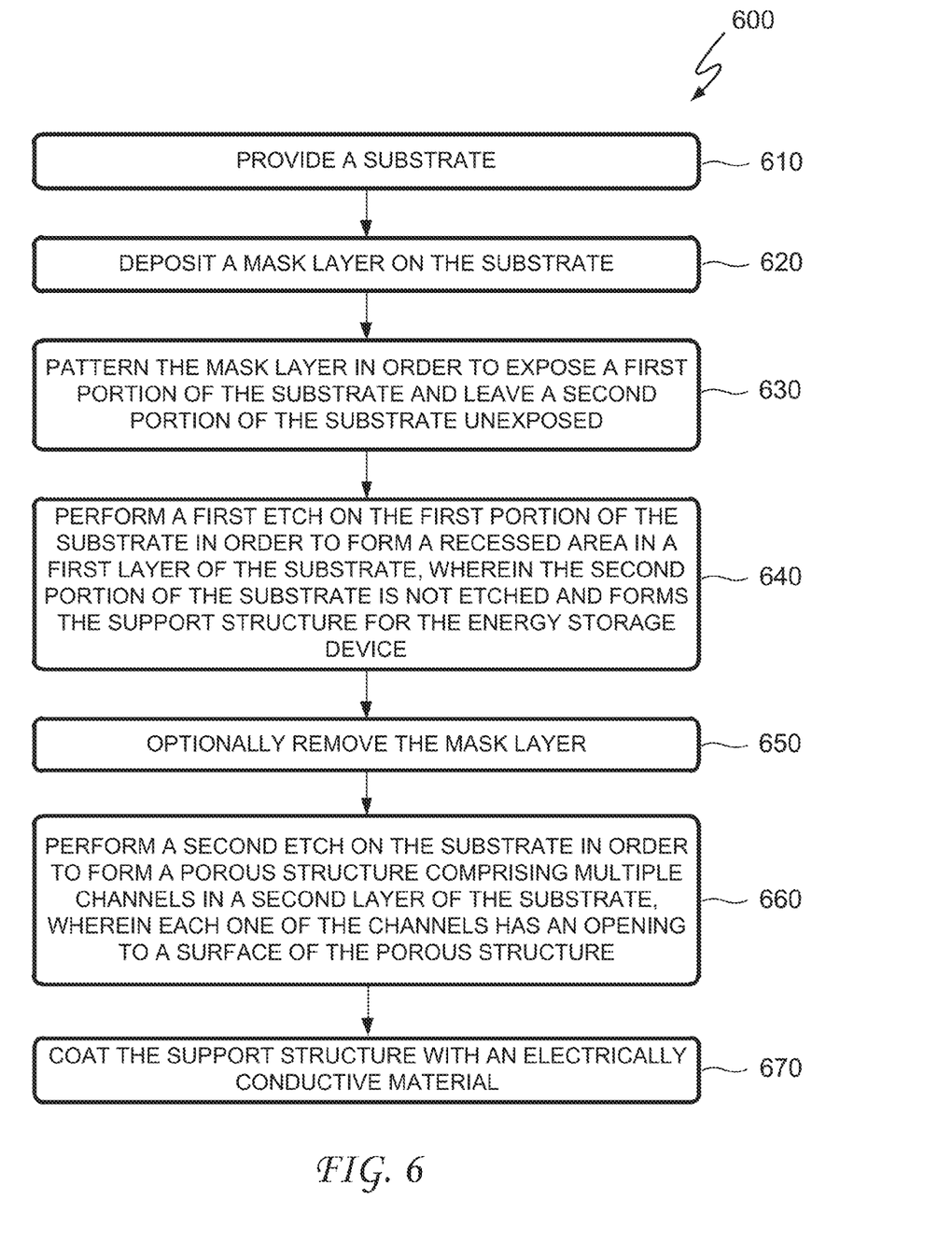
FIG. 6 is a flowchart illustrating a method of manufacturing a support structure for an energy storage device according to an embodiment of the invention.

FIG. 6 is a flowchart illustrating a method 600 of manufacturing a support structure for an energy storage device according to an embodiment of the invention. As an example, method 600 may result in the formation of an energy storage structure similar to energy storage structure 500 that is shown in FIG. 5. Partially completed or intermediary structures formed during the performance of method 600 are illustrated in FIGS. 7-10, as described below.

Figure 7:
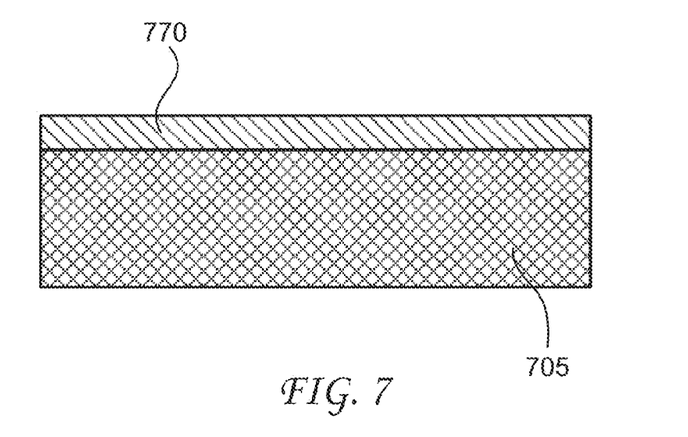
FIGS. 7-9 are cross-sectional views of the support structure and/or the energy storage device (or portions thereof) shown in FIG. 6 at various points during their manufacture according to embodiments of the invention.

A step 610 of method 600 is to provide a substrate. As an example, the substrate can be similar to a substrate 705 that is illustrated in FIG. 7. Suitable materials for substrate 705 include, for example, silicon, germanium, tin, copper, aluminum, nickel, calcium, tungsten, molybdenum, manganese, silicon carbide, and an alloy of silicon and germanium.

A step 620 of method 600 is to deposit a mask layer on the substrate. As an example, the mask layer can be similar to a mask layer 770 that is illustrated in FIG. 7. In certain embodiments, the mask layer comprises silicon dioxide ($SiO_2$), silicon nitride (SiN), or the like. Step 620 can be carried out according to deposition techniques—e.g., chemical vapor deposition (CVD), physical vapor deposition (PVD), and the like—that are well known in the art. Although it may result in a less dense deposition than other techniques, PVD, for example, may be used for applications where lower temperature is desired since it is a relatively low-temperature procedure.

Figure 8:
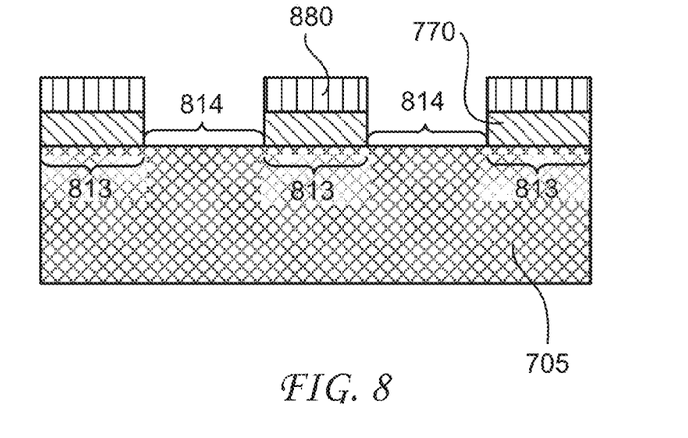

A step 630 of method 600 is to pattern the mask layer in order to expose a first portion of the substrate and leave a second portion of the substrate unexposed. An example of this is shown in FIG. 8, where a photoresist or other similar layer 880 has been formed over mask layer 770 and patterned to expose portions of the mask layer, after which mask layer 770 has been patterned in order to expose corresponding, underlying portions 814 of substrate 705, leaving portions 813 of substrate 705 unexposed. Step 630 can be carried out according to patterning techniques that are well known in the art.

Figure 9:
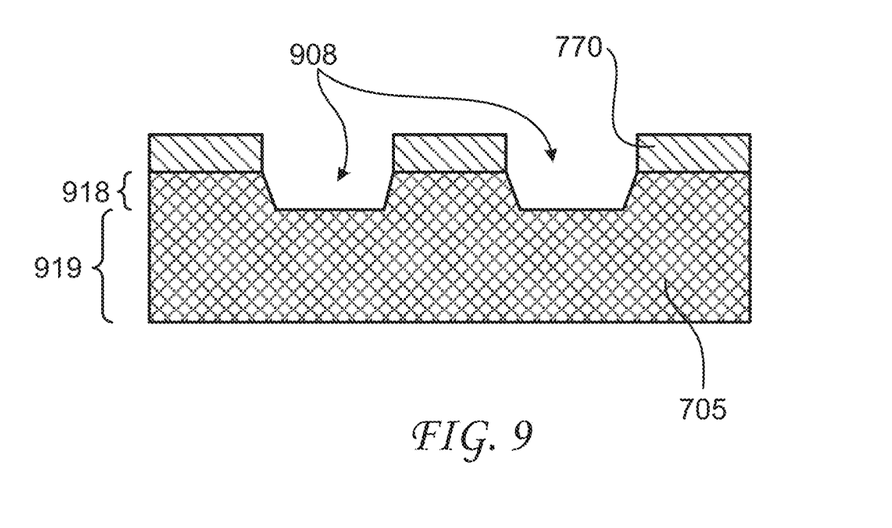

A step 640 of method 600 is to perform a first etch on the first portion of the substrate in order to form a recessed area in a first layer of the substrate, wherein the second portion of the substrate is not etched and forms the support structure for the energy storage device. This is illustrated in FIG. 9, where recessed areas 908 have been formed in a layer 918 of substrate 705. Recessed areas 908 correspond to exposed portions 814, in that, at least in one embodiment, they have been formed by etching into substrate 705 at portions 814. Meanwhile, portions 813, which were not exposed by the mask layer, remain unetched (and therefore non-porous) and thus are sufficiently strong that they can function as a support structure, as will be further shown below. As an example, the first etch can comprise an anisotropic etch using tetramethylammonium hydroxide (TMAH) or potassium hydroxide (KOH).

A step 650 of method 600 is to remove the mask layer. In various embodiments, step 650 may be accomplished using wet etch or dry etch procedures that are well known in the art. Step 650 is an optional step; in certain embodiments the mask layer can be left in place (by skipping step 650) and used as part of the final structure. Further details are given below in connection with the discussion of method 1300 (see especially the discussion of step 1350).

A step 660 of method 600 is to perform a second etch on the substrate in order to form a porous structure comprising multiple channels in a second layer of the substrate, wherein each one of the channels has an opening to a surface of the porous structure. Following the performance of step 660, portions of substrate 705 located in layer 918 that are unetched by the first and second etches form a support structure, while layer 919 contains the porous structure. A structure resulting from the performance of step 660 may be seen by referring again to FIG. 5 and energy storage structure 500, where a layer 519 (corresponding to layer 919 of FIG. 9) has been etched (as in step 660) and thus contains porous structure 510, and where a layer 518 (corresponding to layer 918 of FIG. 9) contains the support structure (502).

Note that the etch performed in step 660 is performed on a side of the wafer opposite the side with the masking layer, as suggested by the inverted orientation of FIG. 5 as compared to the orientation of FIGS. 7-9. In one embodiment, this etch comprises an electrochemical etch using hydrofluoric acid (HF). In a particular embodiment, the electrochemical etch further comprises adding a second substance (e.g., a suitable type of alcohol such as isopropyl alcohol) to the hydrofluoric acid as a means of preventing hydrogen bubbles that would otherwise form and block the HF etching. Appropriate amounts and other details regarding the addition of the isopropyl alcohol (or other substance) are known in the art and are thus not further described here.

In some embodiments, method 600 may include a further step 670, which is to coat the support structure with an electrically conductive material (e.g., TiN). Doing this would help make good electrical contact to the support structure, thereby enabling the further assembly of an electrochemical capacitor or other energy storage device. in one embodiment, step 670 is accomplished using an atomic layer deposition (ALD) process. If porous structure 1010 is an etched-through porous structure, step 670 can comprise a through-substrate ALD process, which is both faster and, because it eliminates a substantial part of the precursor waste, cheaper than conventional ALD processes. In an alternative embodiment, one could deposit, for example, a metal layer on the backside of the substrate in order to form electrical contacts and provide support. This could be accomplished simply by depositing, for example, aluminum in combination with, for example, copper, titanium, TiN, or PbSn using a process such as PVD or CVD.

Figure 10:
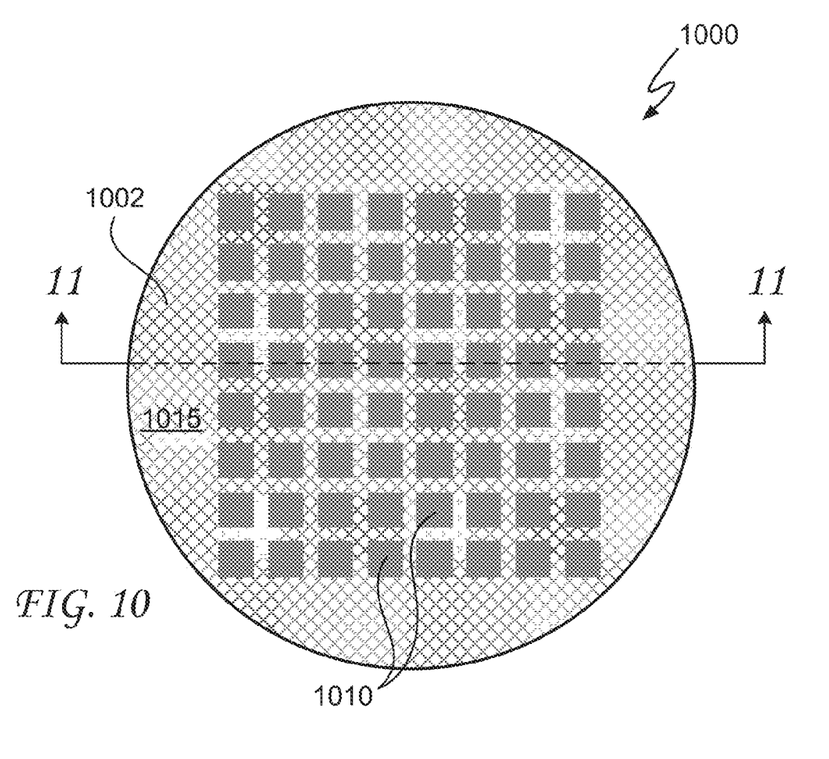
FIGS. 10 and 11 are plan and cross-sectional views, respectively, of a portion of an energy storage structure according to an embodiment of the invention.
Figure 11:
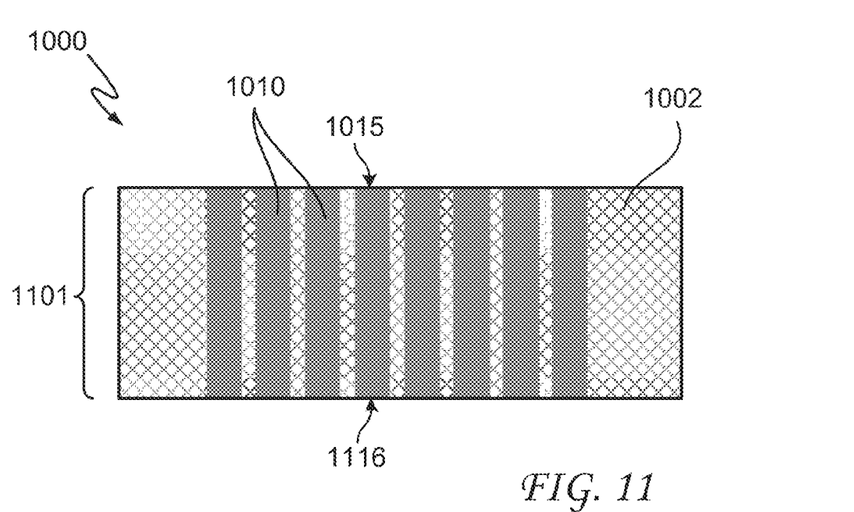

FIG. 10 is a plan view and FIG. 11 is a cross-sectional view of a portion of an energy storage structure 1000 according to an embodiment of the invention. As illustrated in FIGS. 10 and 11, energy storage structure 1000 comprises an energy storage device, of which only multiple porous regions 1010 are shown, and a support structure 1002. Porous regions 1010, which are formed from a first material, contain multiple channels, each one of which has an opening to a surface of the porous structure. The first material can be any of the materials described above as being suitable for porous structures according to embodiments of the invention, namely, silicon, germanium, tin, copper, aluminum, nickel, calcium, tungsten, molybdenum, manganese, silicon carbide, and alloys such as an alloy of silicon and germanium. Porous regions 1010 are thus similar to porous structures 110 and 120 that are shown in FIGS. 1-3 and were described above. Although porous regions 1010 are depicted as having a square shape in FIG. 11, it should be understood that other shapes are also possible, and, in some embodiments, even desirable. For example, though squares offer convenience, circles might be preferable in certain embodiments because they will be less likely to incur stress-related mechanical cracking Other shapes may also be used, and may offer similar, or other, advantages.

Energy storage structure 1000 comprises a substrate 1101 having a surface 1015 and an opposing surface 1116. The channels that are located in porous structure 1010—the channels that make the porous structure porous—are not shown in FIGS. 10 and 11, but in certain embodiments at least some of the channels extend from surface 1015 all the way to surface 1116, and thus are part of what is referred to herein as an etched-through porous structure. Of course, channels that extend from one surface to another in this way may be etched starting at either surface, so that, for example, the structure of FIG. 10 could have been etched starting either from surface 1015 or from surface 1116, with the same end result that is illustrated. Of course, for etching that starts at the side where the mask is located, the masking layer would have to be able to withstand the etching process (e.g., HF for porous silicon).

Support structure 1002, in one embodiment, is formed from the same material from which porous regions 1010 are formed. (It should be understood that although the material is the same, the porous regions have been etched while the regions forming the support structure have not.) In the illustrated embodiment, surface 1015 of energy storage structure 1000 is divided into a plurality of (etched) porous regions and (unetched) support structure regions, where each one of the porous regions is surrounded by support structure.

Figure 12:
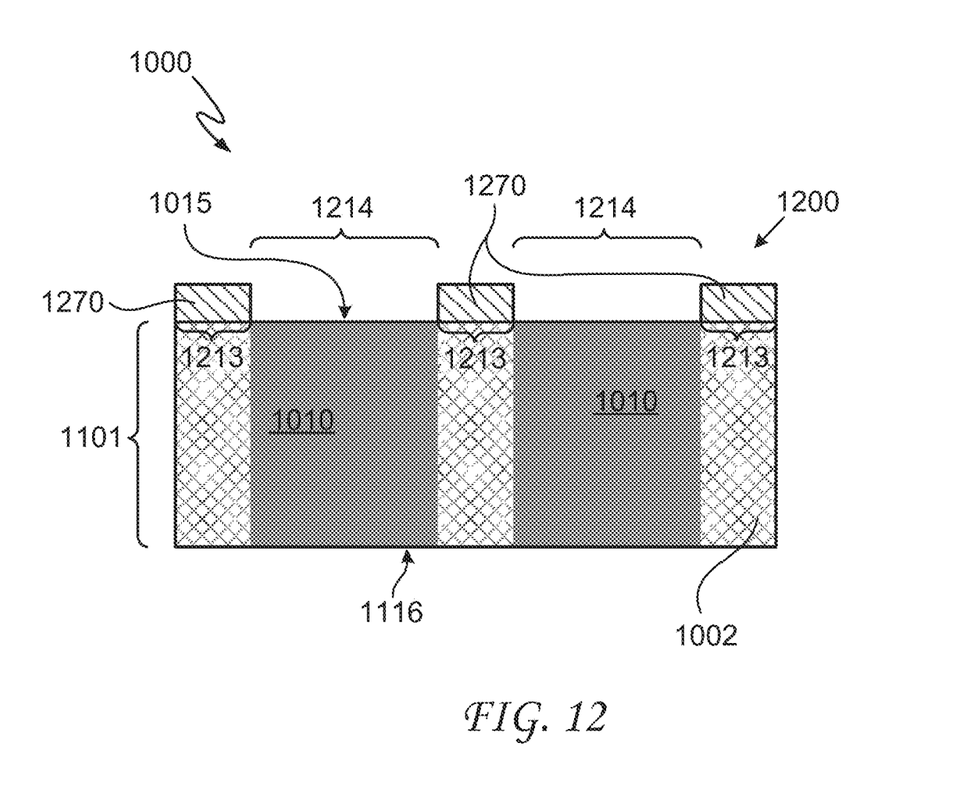
FIG. 12 is a cross sectional view of a portion of the energy storage structure of FIGS. 10 and 11 according to an embodiment of the invention.

FIG. 12 is a cross sectional view of a portion 1200 of energy storage structure 1000 according to an embodiment of the invention at a particular point in its manufacturing process. Specifically, FIG. 12 depicts the illustrated portion of energy storage structure 1000 at a time when a mask layer 1270 is located over, and covers, unexposed regions 1213 of substrate 1101. As an example, mask layer 1270 can be similar to mask layer 770 that is shown in FIG. 7. Portion 1200 includes two porous regions and three sections of support structure 1002; the wafer 1000 contains additional porous regions and additional support structure sections, as depicted in FIGS. 10 and 11.

Figure 13:
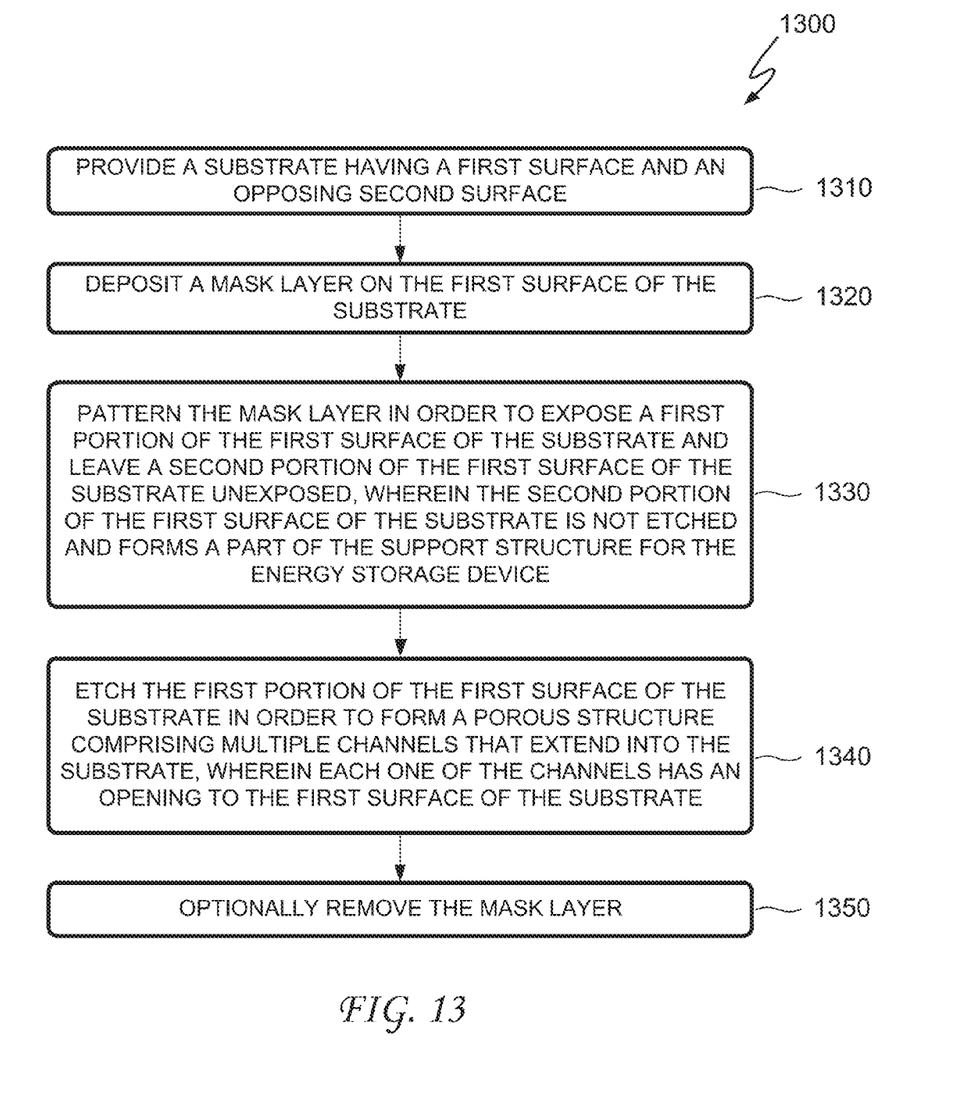
FIG. 13 is a flowchart illustrating a method of manufacturing a support structure for an energy storage device according to an embodiment of the invention.

FIG. 13 is a flowchart illustrating a method 1300 of manufacturing a support structure for an energy storage device according to an embodiment of the invention. As an example, method 1300 may result in the formation of an energy storage structure similar to energy storage structure 1100 that is shown in FIGS. 10 and 11.

A step 1310 of method 1300 is to provide a substrate having a first surface and an opposing second surface.

A step 1320 of method 1300 is to deposit a mask layer on the first surface of the substrate. As an example, the mask layer can be similar to mask layer 1270 that is shown in FIG. 12. Step 1320 can be carried out according to deposition techniques that are well known in the art, as described above in connection with step 620.

A step 1330 of method 1300 is to pattern the mask layer in order to expose a first portion of the first surface of the substrate and leave a second portion of the first surface of the substrate unexposed, wherein the second portion of the first surface of the substrate is not etched and forms apart of the support structure for the energy storage device. Step 1330 can be carried out according to patterning techniques that are well known in the art.

A step 1340 of method 1300 is to etch the first portion of the first surface of the substrate in order to form a porous structure comprising multiple channels that extend into the substrate, wherein each one of the channels has an opening to the first surface of the substrate With reference to FIG. 12, this etch is performed in exposed regions 1214 of substrate 1101 and results in the creation of the illustrated regions of porous structure 1010. As shown, mask layer 1270 prevents etching from occurring within unexposed regions 1213. As stated above, in one embodiment the porous structure is formed within a material that is one of silicon, germanium, tin, copper, aluminum, nickel, calcium, tungsten, molybdenum, manganese, silicon carbide, and an alloy of silicon and germanium. In some embodiments, at least some of the channels extend all the way through the substrate from the first surface to the second surface such that they also have an opening to the second surface of the substrate.

A step 1350 of method 1300 is to remove the mask layer. Step 1350 can be carried out according to deposition techniques that are well known in the art, as described above in connection with step 650. Step 1350 is an optional step; in certain embodiments the mask layer can be left in place (by skipping step 1350) and used as part of the final structure. Leaving the mask layer in place could provide additional mechanical support and could in some instances act as an electrical contact. In certain embodiments, in fact, the mask layer may be left in place and may then act as the main—or even as the only—mechanical support. In other words, certain embodiments of an energy storage device may dispense altogether with other support structures such as those described herein in favor of the mask layer, which would then be used as the exclusive support structure for that energy storage device. Examples of this may be seen by referring to FIGS. 8 and 9. With reference to FIG. 8, an energy storage device of the kind being described here could be formed by removing photoresist layer 880 and etching part or all of substrate 705 in order to form a porous structure in the portions that are etched. Similarly, with reference to FIG. 9, an exemplary energy storage device could be formed by etching part or all of substrate 705 in order to form a porous structure in the portions that are etched. In various embodiments, the etching could be performed only in a portion (but not all) of layer 919, in all of layer 919 but in none of layer 918, in all of layer 919 and in some but riot all of layer 918, in all of both of these layers, or in some other configuration. In all of these examples, mask layer 770 could act as the sole support structure for the energy storage device. Alternatively, the mask layer could act as one of multiple support structures.

Figure 14:
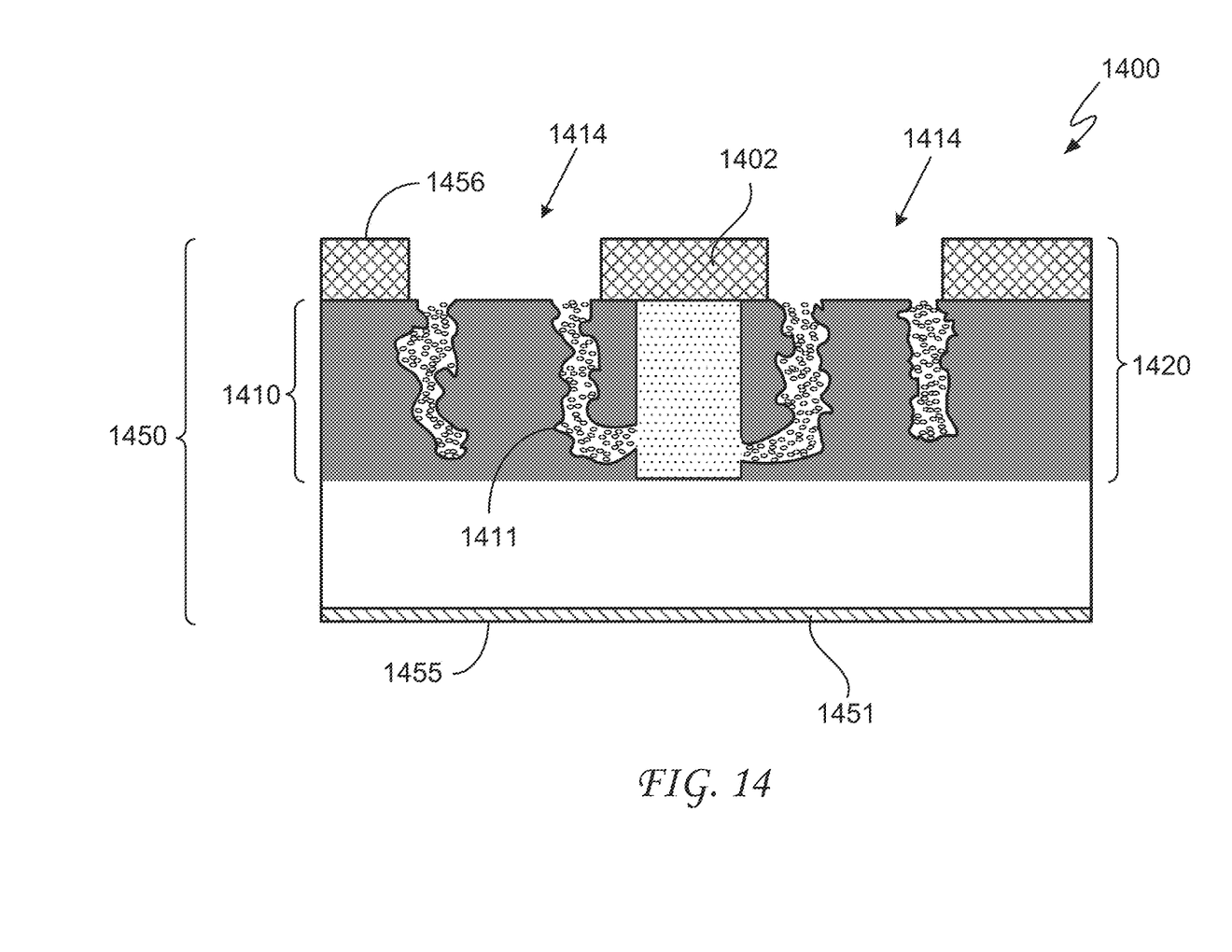
FIG. 14 is a cross-sectional view of a microelectronic assembly according to an embodiment of the invention.

FIG. 14 is a cross-sectional view of a microelectronic assembly 1400 according to an embodiment of the invention. As illustrated in FIG. 14, microelectronic assembly 1400 comprises an integrated circuit (IC) die 1450 and an energy storage structure 1420 associated with IC die 1450. In the illustrated embodiment, energy storage structure 1420 is similar to energy storage structure 500 as depicted in FIG. 5. However, other configurations of both the energy storage device and the associated support structure are also possible, including any of the other devices and structures disclosed herein.

Die 1450 has an active area 1451 containing transistors and other circuitry (not shown) that define a front side 1455 of die 1450. As an example, the active area circuitry could be used as a microprocessor or in an SoC (system-on-chip). Energy storage structure 1420 includes a porous structure 1410 that, in certain embodiments, can be formed by etching die 1450 starting at a back side 1456. The process may involve the use of a mask layer as described elsewhere herein, and may result in the formation of a support structure 1402 that is similar in its structure and in the details of its creation to support structure 502 as depicted in FIG. 5. Although only two channels 1411 are shown as being etched into each exposed region 1414 of porous structure 1410 (between sections of support structure 1402), it should be understood that in reality many hundreds or thousands or channels would exist in each exposed region. If necessary, though the drawing does not reflect it, the electrolyte that these channels contain could be held in place by sealing the channels with a polyimide or other suitable material. In certain embodiments, energy storage structure 1420 can be connected to active area 1451 using through silicon vias (TSVs) (not shown).

In certain embodiments, microelectronic assembly 1400 can be mounted on or otherwise attached to a substrate (not shown). This substrate—sometimes referred to as a "package substrate"—may comprise any suitable type of substrate capable of providing electrical communications between die 1450 and a next-level component to which microelectronic assembly 1400 is coupled (e.g., a circuit board). In another embodiment, the substrate may comprise any suitable type of substrate capable of providing electrical communication between die 1450 and an upper IC package coupled with microelectronic assembly 1400, and in a further embodiment the substrate may comprise any suitable type of substrate capable of providing electrical communication between the upper IC package and a next-level component to which microelectronic assembly 1400 is coupled. The substrate may also provide structural support for the die 1450.

By way of example, in one embodiment, the substrate comprises a multi-layer substrate—including alternating layers of a dielectric material and metal—built-up around a core layer (either a dielectric or metal core). In another embodiment, the substrate comprises a coreless multi-layer substrate. Other types of substrates and substrate materials may also find use with the disclosed embodiments (e.g., ceramics, sapphire, glass, and the like). Further, according to one embodiment, the substrate may comprise alternating layers of dielectric material and metal that are built-up over the die itself, in a. process sometimes referred to as a "bumpless build-up process." Where such an approach is utilized, traditional interconnect structures may not be needed (as the build-up layers may be disposed directly over die 1450).

IC die 1450 may comprise any type of integrated circuit device. In one embodiment, the die includes a processing system (either single core or multi-core). For example, the die may comprise a microprocessor, a graphics processor, a signal processor, a network processor, a chipset, etc. In one embodiment, IC die 1450 comprises a system-on-chip having multiple functional units (e.g., one or more processing units, one or more graphics units, one or more communications units, one or more signal processing units, one or more security units, and so forth). However, it should be understood that the disclosed embodiments are not limited to any particular type or class of IC devices.

Figure 15:
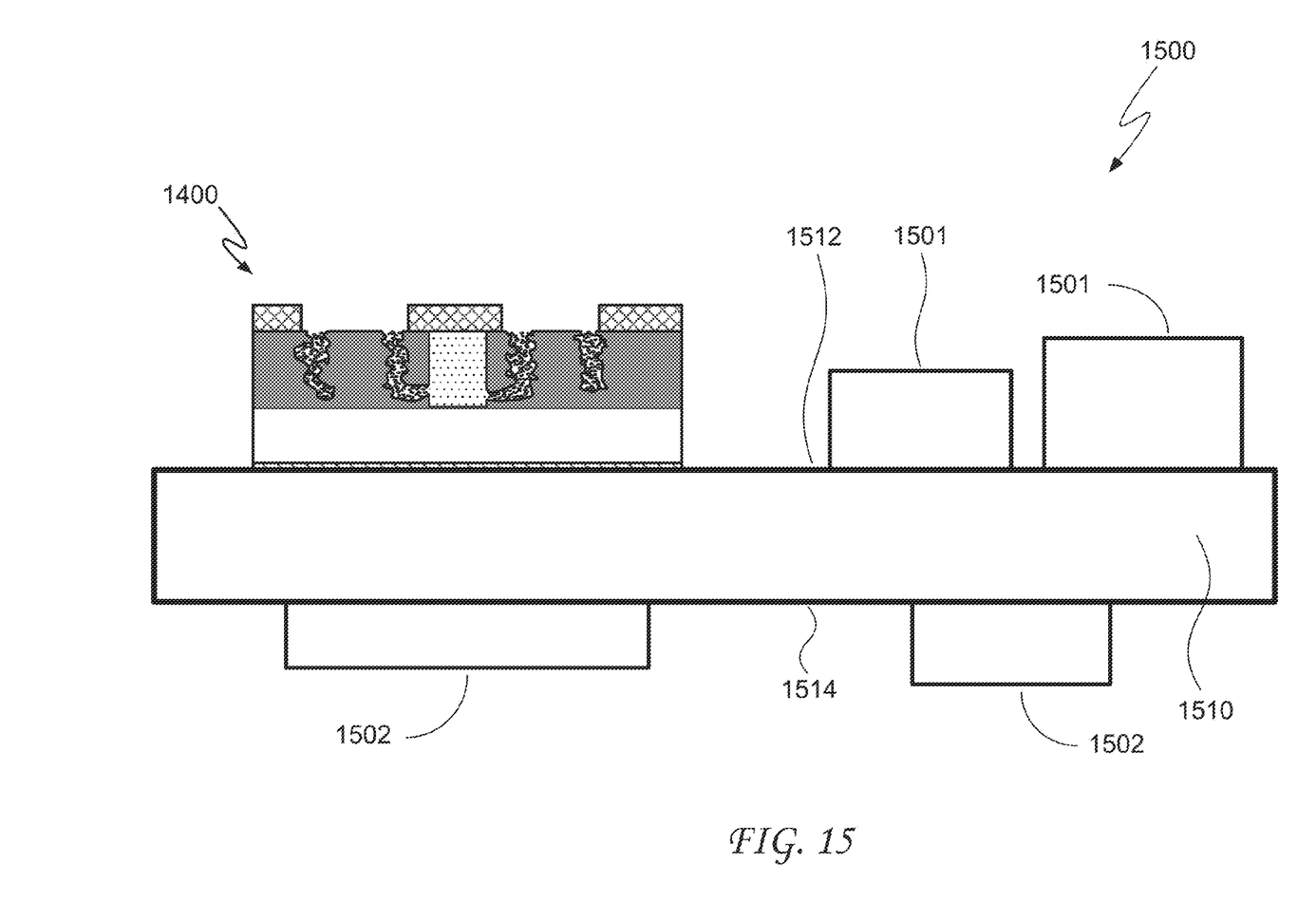
FIG. 15 is a schematic view of a computing system according to an embodiment of the invention.

Turning now to FIG. 15, illustrated is an embodiment of a computing system 1500. System 1500 includes a number of components disposed on a board 1510 such as a motherboard, mainboard, or other circuit board. Board 1510 includes a side 1512 and an opposing side 1514, and various components may be disposed on either one or both of sides 1512 and 1514. In the illustrated embodiment, computing system 1500 includes a microelectronic assembly 1400 disposed on side 1512 of board 1510, and microelectronic assembly 1400 may comprise any of the embodiments described herein. Accordingly, microelectronic assembly 1400 may comprise a die (or other microprocessor) and an energy storage structure, as previously described. System 1500 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Board 1510 may comprise any suitable type of circuit board or other substrate capable of providing electrical communication between one or more of the various components disposed on the board. In one embodiment, for example, board 1510 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with board 1510. However, it should be understood that the disclosed embodiments are not limited to the above-described PCB and, further, that board 1510 may comprise any other suitable substrate.

In addition to energy storage structure 1550, one or more additional components may be disposed on either one or both sides 1512, 1514 of board 1510. By way of example, as shown in the figures, components 1501 may be disposed on side 1512 of board 1510, and components 1502 may be disposed on the board's opposing side 1514. Additional components that may be disposed on the board 1510 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices. In one embodiment, computing system 1500 includes a radiation shield. In a further embodiment, computing system 1500 includes a cooling solution. In yet another embodiment, computing system 1500 includes an antenna. In yet a further embodiment, the system 1500 may be disposed within a housing or case. Where board (510 is disposed within a housing, some of the components of computer system 1500—e.g., a user interface device, such as a display or keypad, and/or a power supply, such as a battery—may be electrically coupled with board 1510 (and/or a component disposed on this board) but may be mechanically coupled with the housing.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the energy storage structure and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An energy storage structure comprising:
   an energy storage device comprising at least one porous structure, the porous structure being formed from a first material, wherein the porous structure contains multiple channels, each one of which has an opening to a first surface of the porous structure; and
   a support structure for the energy storage device, the support structure formed from the first material, wherein the support structure physically contacts a first portion of the energy storage device and exposes a second portion of the energy storage device.

2. The energy storage structure of claim 1 wherein:
   at least some of the channels extend from the first surface of the porous structure and completely through the porous structure to an opposing second surface of the porous structure.

3. The energy storage structure of claim 2 wherein:
   the support structure physically contacts the second surface of the porous structure; and
   the physically contacted first portion of the energy storage device is a first portion of the second surface of the porous structure and the exposed second portion of the energy storage device is a second portion of the second surface of the porous structure.

4. A microelectronic assembly comprising:
   a die; and
   an energy storage structure associated with the die, wherein the energy storage structure comprises:
   an energy storage device comprising at least one porous structure, the porous structure formed from a first material, wherein the porous structure contains multiple channels, each one of which has an opening to a surface of the porous structure; and
   a support structure for the energy storage device, the support structure formed from the first material, wherein the support structure physically contacts a first portion of the energy storage device and exposes a second portion of the energy storage device.

5. The microelectronic assembly of claim 4 wherein:
   the die has a front side and an opposing back side, the front side comprising an active area containing circuitry; and
   the porous structure is located in the back side of the die.

6. The microelectronic assembly of claim 4 wherein:
   at least some of the channels extend from the surface of the porous structure and completely through the porous structure to an opposing second surface of the porous structure.

7. The microelectronic assembly of claim 6 wherein:
the support structure physically contacts the second surface of the porous structure; and
the physically contacted first portion of the energy storage device is a first portion of the second surface of the porous structure and the exposed second portion of the energy storage device is a second portion of the second surface of the porous structure.

8. A microelectronic system comprising:
a board; and
a microelectronic assembly coupled to the board, wherein the microelectronic assembly comprises:
   a die; and
an energy storage structure associated with the die, wherein the energy storage structure comprises:
   an energy storage device comprising at least one porous structure, the porous structure formed from a first material, wherein the porous structure contains multiple channels, each one of which has an opening to a surface of the porous structure; and
   a support structure for the energy storage device, the support structure formed from the first material, wherein the support structure physically contacts a first portion of the energy storage device and exposes a second portion of the energy storage device.

9. The microelectronic system of claim 8 wherein:
at least some of the channels extend from the surface of the porous structure and completely through the porous structure to an opposing second surface of the porous structure.

10. The microelectronic system of claim 9 wherein:
the support structure physically contacts the second surface of the porous structure; and
the physically contacted first portion of the energy storage device is a first portion of the second surface of the porous structure and the exposed second portion of the energy storage device is a second portion of the second surface of the porous structure.

\* \* \* \* \*